(12) United States Patent
Kim et al.

(10) Patent No.: US 8,564,198 B2
(45) Date of Patent: Oct. 22, 2013

(54) DISPLAY APPARATUS INCLUDING ENHANCED SEALING PORTION

(75) Inventors: Tae-Kyu Kim, Yongin (KR); Eun-Ah Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 56 days.

(21) Appl. No.: 13/399,899

(22) Filed: Feb. 17, 2012

(65) Prior Publication Data

US 2012/0319574 A1   Dec. 20, 2012

(30) Foreign Application Priority Data

Jun. 16, 2011 (KR) .................. 10-2011-0058635

(51) Int. Cl.
*H05B 33/04* (2006.01)
(52) U.S. Cl.
USPC .......................................... 313/512; 313/506
(58) Field of Classification Search
USPC ............................... 313/495–512; 445/24–25
See application file for complete search history.

(56) References Cited

U.S. PATENT DOCUMENTS

| 7,247,986 B2 | 7/2007 | Kang et al. |
| 2005/0184927 A1* | 8/2005 | Kwak ............................ 345/45 |
| 2007/0195252 A1 | 8/2007 | Tsai et al. |
| 2010/0181902 A1* | 7/2010 | Kita ............................ 313/504 |

FOREIGN PATENT DOCUMENTS

| KR | 10-2005-0022538 | 3/2005 |
| KR | 10-2006-0005369 | 1/2006 |
| KR | 10-2006-0077466 | 7/2006 |
| KR | 10-2007-0085020 | 8/2007 |
| KR | 10-2008-0051788 | 6/2008 |
| KR | 10-2009-0041613 | 4/2009 |

* cited by examiner

*Primary Examiner* — Anh Mai
*Assistant Examiner* — Elmito Breval
(74) *Attorney, Agent, or Firm* — Robert E. Bushnell, Esq.

(57) ABSTRACT

A display apparatus includes an enhanced sealing portion. The display apparatus includes a substrate unit that includes a first substrate and a second substrate facing each other; a sealing portion that is disposed between the first substrate and the second substrate; and a metal film that is disposed between the first substrate and the sealing portion. Open holes having different sizes are formed in proportion to energy intensities of an energy source applied to the metal film. During sealing in a sealing region by using a laser, since the metal film having a specific shape is patterned, even when energy having an irregular Gaussian shape is applied, uniform energy may be applied to the sealing portion. Accordingly, an adhesive force in the sealing region may be increased.

21 Claims, 5 Drawing Sheets

DISPLAY APPARATUS INCLUDING ENHANCED SEALING PORTION

CLAIM OF PRIORITY

This application makes reference to, incorporates the same herein, and claims all benefits accruing under 35 U.S.C. §119 from an application earlier filed in the Korean Intellectual Property Office on 16 Jun. 2011 and there duly assigned Serial No. 10-2011-0058635.

BACKGROUND OF THE INVENTION

1. Field of the Invention

An embodiment of the present invention relates to a display apparatus, and more particularly, to a display apparatus including an enhanced sealing portion to ensure good sealing uniformity in a sealing region disposed between substrates.

2. Description of the Related Art

In general, a flat panel display apparatus such as an organic light-emitting display apparatus including a thin film transistor (TFT) has been highlighted as a display apparatus for electrical mobile devices such as digital cameras, video cameras, camcorders, mobile information terminals, or smart phones.

An organic light-emitting display apparatus may be sealed in order to protect an organic light-emitting layer from the external environment. Therefore, a plurality of substrates may be bonded to one another by applying a sealing material between the plurality of substrates and by hardening the sealing material by irradiating a laser beam onto the sealing material.

During the procedure of sealing the display apparatus by using a laser beam, the laser beam generally has a Gaussian profile having a projecting central portion. Because of such Gaussian profile, when the laser beam is irradiated onto the sealing material, a central portion of the sealing portion disposed between the substrates is more excessively heated than a peripheral portion of the sealing portion. Accordingly, due to the difference of the sealing energy between the central portion of the laser beam and the peripheral portion of the laser beam, irregular bonding may occur between the corresponding central portion of sealing portion and the corresponding peripheral portion of the sealing portion. Accordingly, irregular adhesion between the substrates may occur due to a difference in sealing uniformity due to the difference in sealing energy between different portions of the laser beam, thereby resulting in a difference in bonding strength between difference portions of the substrates.

SUMMARY OF THE INVENTION

An aspect of the present invention provides a display apparatus including an enhanced sealing portion which may increase an adhesive force by ensuring good uniformity at the sealing region irrespective of the irregular sealing energy during the procedure of sealing the display apparatus.

In accordance with another aspect of the present invention, a display apparatus includes a substrate unit that has a first substrate and a second substrate facing each other; a sealing portion that is disposed between the first substrate and the second substrate, and a metal film that is disposed between the first substrate and the sealing portion. The metal film has open holes, and the sizes of the open holes are in proportion to energy intensities of an energy source applied to the metal film.

Sizes of the open holes may be reduced from a portion with a highest energy intensity of the energy source toward a portion with a lower energy intensity of the energy source.

At least a fraction of the metal film may overlap with the sealing portion. Sizes of the open holes may be reduced from a central portion of the metal film toward edges of the metal film.

Sizes of a plurality of open holes which are aligned along an axis of symmetry of the metal film at the central portion in a width direction of the metal film may be the largest; sizes of a plurality of open holes which are aligned along the axis of symmetry of the metal film at leftmost and rightmost edges in the width direction of the metal film may be the smallest.

The open holes may be laterally symmetrical with each other about the central portion in a width direction of the metal film.

The sealing portion and the metal film may be continuously connected along edges of the first substrate; the open holes may be discontinuously formed in a longitudinal direction of the metal film.

The open holes may have the same size in the longitudinal direction of the metal film, and may have different sizes in the width direction of the metal film.

The open holes may be formed at predetermined intervals in the longitudinal direction of the metal film to have the same size, and the open holes may be formed at predetermined intervals to have sizes reduced toward from a center toward an edge in the width direction of the metal film.

The sealing portion and the metal film may be continuously connected along edges of the first substrate, and the open holes may be continuously formed in the longitudinal direction of the metal film.

The open holes may be formed at predetermined intervals to have sizes reduced from a center toward an edge in a width direction of the metal film.

The open holes may be grooves that penetrate the metal film in a thickness direction.

The energy source may be a laser beam.

The display apparatus may further include an organic light-emitting display device. The first substrate may be divided into a display portion that is a light-emitting area, and a non-display portion that is formed outside the display portion. The metal film may be formed of the same material as that of a pattern layer formed on the display portion.

The organic light-emitting display device may include a first electrode, a light-emitting portion, and a second electrode that are formed on the first substrate. The metal film may be formed of the same material as that of the second electrode.

The sealing portion may include glass frit.

The metal film may be formed of an alloy including at least one of lithium (Li), calcium (Ca), lithium fluoride (LiF), aluminum (Al), magnesium (Mg), molybdenum (Mo), titanium (Ti), and silver (Ag).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
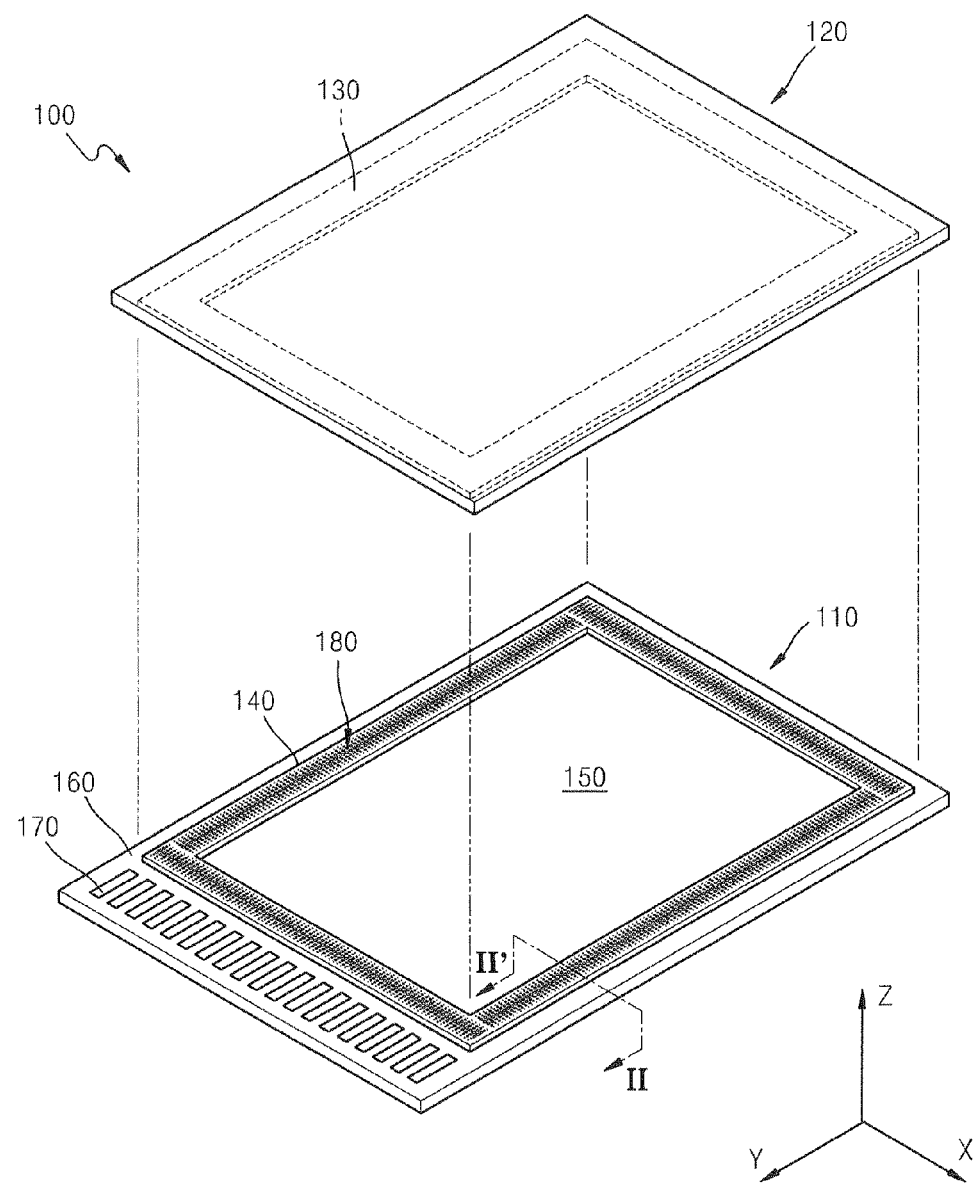
FIG. 1 is an exploded perspective view illustrating a display apparatus constructed with an embodiment of the present invention.

While exemplary embodiments are capable of various modifications and alternative forms, embodiments thereof are shown by way of example in the drawings and will herein be described in detail. It should be understood, however, that there is no intent to limit embodiments to the particular forms disclosed, but on the contrary, embodiments are to cover all modifications, equivalents, and alternatives falling within the scope of the invention. In the following description of the present invention, only essential parts for understanding operation of the present invention will be described and other parts may be omitted in order not to make the subject matter of the present invention unclear.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Reference will now be made in detail to embodiments, examples of which are illustrated in the accompanying drawings. In the drawings, the same elements are denoted by the same reference numerals, and a repeated explanation thereof will not be given.

Figure 2:
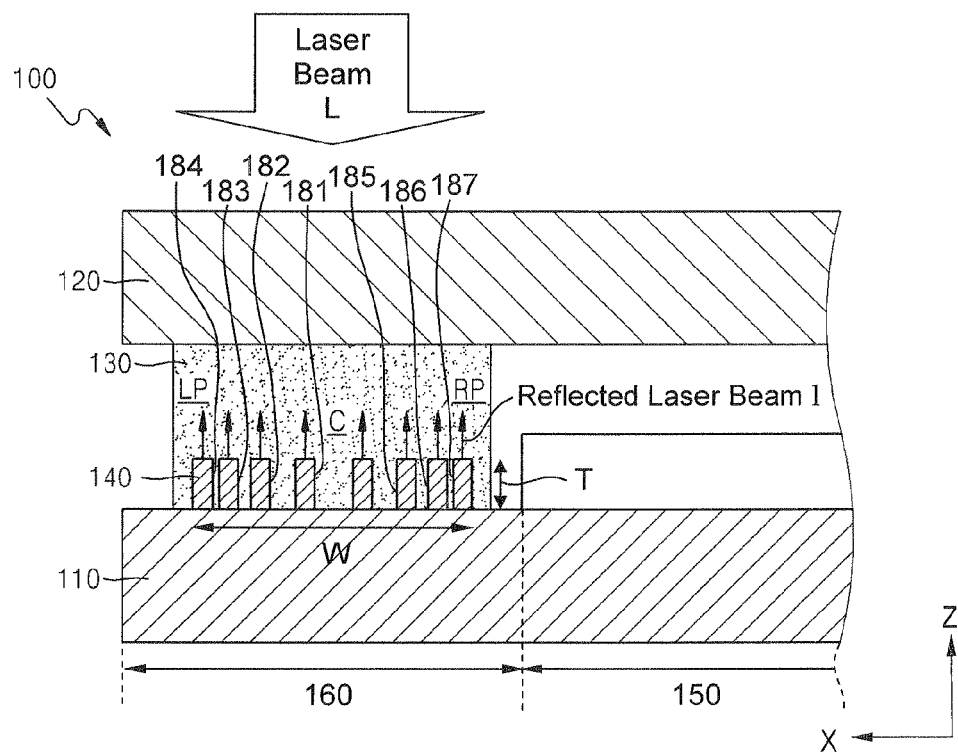
FIG. 2 is an enlarged cross-sectional view taken along line II-II' of a sealing region of the display apparatus of FIG. 1.
Figure 3:
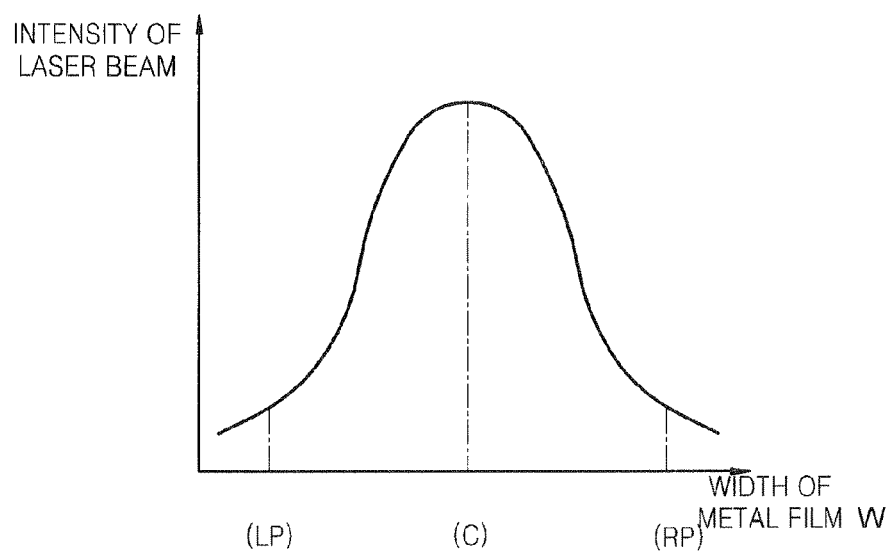
FIG. 3 is a graph illustrating a profile of a laser beam used during a sealing process of the display apparatus of FIGS. 1 and 2.

FIG. 1 is an exploded perspective view illustrating a display apparatus 100 constructed with an embodiment of the present invention. FIG. 2 is an enlarged cross-sectional view taken along line II-II' of a sealing region of the display apparatus of FIG. 1. FIG. 3 is a graph illustrating a profile of a laser beam used during a sealing process of the display apparatus of FIGS. 1 and 2.

Referring to FIG. 1, the display apparatus 100 includes a first substrate 110, a second substrate 120, a sealing portion 130, and a metal film 140.

Although the first substrate 110 is a glass substrate formed of, for example, soda-lime glass, in FIG. 1, the present embodiment is not limited thereto and the first substrate 110 may be formed of an insulating polymer material.

The first substrate 110 is divided into a display portion 150 that is a light-emitting area, and a non-display portion 160 that is formed outside the display portion 150. In one embodiment, the non-display portion 160 may surround the display portion 150 and may be contiguous with the display portion 150. Even though the display portion 150 as shown in FIG. 1 includes an organic light-emitting device, the present embodiment is not limited thereto and the display portion 150 may include another display device such as a liquid crystal display (LCD) device.

A plurality of electrical terminals 170 connected to a flexible printed circuit board (FPCB) (not shown) or to a hard PCB (not shown) may be arranged on the non-display portion 160.

The second substrate 120 faces the first substrate 110. The second substrate 120 protects the display portion 150 from external moisture, oxygen, or the like, and may be formed of a transparent material. The second substrate 120 may be formed of any of other materials according to a light-emitting direction of the display apparatus 100.

As shown in FIG. 2, the sealing portion 130 is disposed between the first substrate 110 and the second substrate 120. The sealing portion 130 is formed along edges of the first substrate 110 and the second substrate 120 which are coupled to each other by the sealing portion 130. More preferably, the sealing portion 130 is formed on the non-display portion 160 along a circumference of the display portion 150. The sealing portion 130 is formed in a continuous band shape along the circumference of the display portion 150. The sealing portion 130 includes glass frit.

The metal film 140 is disposed between the first substrate 110 and the sealing portion 130. It is preferable to form the metal film 140 on the first substrate 110 on which the display portion 150 is formed, because the metal film 140 may be formed at the same time as a specific pattern layer of the display portion 150 is formed on the first substrate 110.

As shown in FIG. 2, the metal film 140 corresponds to the sealing portion 130, the metal film 140 is grown in Z direction perpendicular to X direction in which the first and second substrates 110 and 120 which are coupled to each other are disposed. At least one portion of the metal film 140 overlaps with the sealing portion 130 along the circumference of the display portion 150. The metal film 140 may be formed of an alloy including at least one of lithium (Li), calcium (Ca), lithium fluoride (LiF), aluminium (Al), magnesium (Mg), molybdenum (Mo), titanium (Ti), and silver (Ag). In one embodiment, the metal film 140 may be formed within the sealing portion 130.

In the display apparatus 100 constructed as described above, when the first substrate 110 and the second substrate 120 are aligned with each other as shown in FIG. 2 and a laser beam L is irradiated onto a top surface of the second substrate 120, the sealing portion 130 disposed between the first substrate 110 and the second substrate 120 may be hardened by the laser beam L.

When the laser beam L is irradiated onto the sealing portion 130, the at least one portion of the metal film 140 overlapping with the sealing portion 130 on the first substrate 110 reflects the laser beam in a direction marked by an arrow.

Accordingly, the sealing portion 130 is hardened first by the laser beam L irradiated onto the top surface of the second substrate 120, and is hardened second by the laser beams l reflected by the metal film 140. Accordingly, the sealing portion 130 may be firmly hardened.

As shown in FIG. 3, the laser beam L irradiated onto the metal film 140 has a Gaussian profile as shown in FIG. 3. That is, in a width direction W of the metal film 140, an energy intensity of the laser beam L at a central portion C of the metal film 140 is the largest, and the intensity is reduced toward a left edge portion LP and a right edge portion RP of the metal film 140.

Accordingly, when the laser beam L is irradiated, in the width direction W of the metal film 140, higher energy is incident on the central portion C than on the left edge portion LP and the right edge portion RP. Accordingly, the metal film 140 has an irregular energy distribution to irregularly expand during the irradiation of the laser beam L, and then irregularly contracts during cooling after the irradiation of the laser beam L.

Such irregular expansion and irregular contraction may cause a residual stress to vary according to different regions of the metal film 130. As a result, sealing uniformity of the sealing portion 130 for sealing the first substrate 110 and the second substrate 120 is reduced due to the varied residual stress. In order to prevent sealing uniformity from being reduced, open holes 180 (i.e., holes 181 through 187) having different sizes may be formed in the metal film 140 in proportion to energy intensities of a laser beam applied to the metal film 140.

Figure 4:
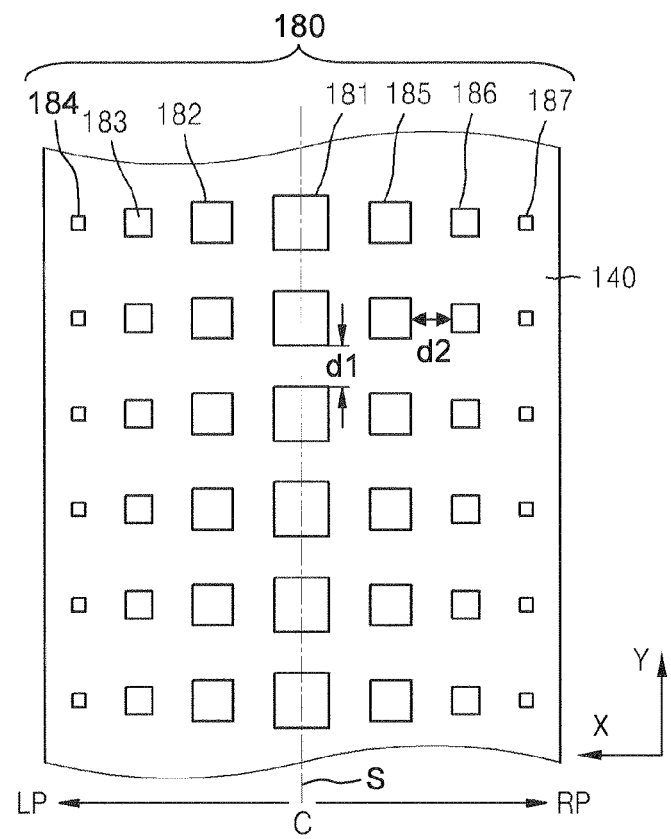
FIG. 4 is an enlarged plan view illustrating a pattern of a metal film of the display apparatus of FIG. 1.

FIG. 4 is an enlarged plan view illustrating a pattern of the metal film 140 of the display apparatus 100 of FIG. 1.

Referring to FIG. 4, the metal film 140 is continuously connected in one direction (Y direction) of the first substrate 110 (also see FIG. 1). The metal film 140 is patterned in a quadrangular shape along a circumference of the display portion 150.

The open holes 180 having different sizes are formed in the metal film 140. That is, the open holes 180 are formed in an arrangement in which, as an energy intensity of a laser beam irradiated onto a portion of the metal film 140 is reduced, the size of the open hole 180 disposed on such portion of the metal film 140 is reduced. The open holes 180 pass through the metal film 140 in a thickness direction T (see FIG. 2).

The open holes 180 may be formed at predetermined intervals such that sizes of the open holes 180 are reduced from a central portion toward an edge portion in a width direction of the metal film 140. Among all of the open holes 180, a plurality of first open holes 181 which are aligned in one direction (that is, Y direction along which the metal film 140 extends) at the central portion C in the width direction of the metal film 140 where an energy intensity of a laser beam is the highest have the largest size. The width direction W of the metal film 140 is perpendicular to the extending direction of the metal film 140.

Meanwhile, the open holes 180 are formed such that sizes of a plurality of second open holes 182, a plurality of third open holes 183, and a plurality of fourth open holes 184 which are aligned with the axis of symmetry S of the metal film 140 in the left edge portion LP where an energy intensity of a laser beam is lower are gradually reduced in the order listed above; sizes of a plurality of fifth open holes 185, a plurality of sixth open holes 186, and a plurality of seventh open holes 187 which are aligned with the axis of symmetry S in the right edge portion RP where an energy intensity of a laser beam is lower are gradually reduced in the order listed above. Sizes of the open holes 180 may vary in proportion to energy intensities of a laser beam, for example, in linear proportion.

Also, the plurality of fifth open holes 185, the plurality of sixth open holes 186, and the plurality of seventh open holes 187 which are aligned with the axis of symmetry S in the right edge portion RP are symmetrical respectively with the plurality of second open holes 182, the plurality of third open holes 183, and the plurality of fourth open holes 184 which are aligned with the axis of symmetry S in the left edge portion LP about the central portion C in the width direction of the metal film 140.

In one embodiment, open holes 180 may be aligned with the axis of symmetry S of the metal film 140. The open holes 180 penetrate the metal film 140.

In one embodiment, open holes 184 may be symmetrical with open holes 187 with respect to the axis of symmetry S of the metal film 140; open holes 183 may be symmetrical with open holes 186 with respect to the axis of symmetry S of the metal film 140; open holes 182 may be symmetrical with open holes 185 with respect to the axis of symmetry S of the metal film 140; and open holes 181 may be formed symmetrically with respect to the axis of symmetry S of the metal film 140.

Accordingly, the open holes 180 are formed such that sizes of the plurality of first open holes 181 which are aligned with the axis of symmetry S at the central portion C in the width direction of the metal film 140 are the largest; sizes of the plurality of fourth open holes 184 which are aligned with the axis of symmetry S at a leftmost edge and the plurality of seventh open holes 187 which, are aligned with the axis of symmetry S at a rightmost edge are the smallest.

Since an energy intensity of a laser beam irradiated onto the metal film 140 is the highest at the central portion C of the metal film 140, an energy intensity of a laser beam may be relatively reduced by maximizing sizes of the open holes 180 at the central portion C; since an energy intensity of a laser beam is reduced toward the left edge portion LP and the right edge portion RP, sizes of the open holes 180 are gradually reduced in proportion to energy intensities of the applied laser beam, thereby relatively increasing the energy intensity of the laser beam applied at the left edge portion LP and the right edge portion RP.

In addition, the open holes 180 are discretely formed in a longitudinal direction (Y direction) of the metal film 140. In FIG. 4, the open holes 180 are arranged at predetermined intervals, not in a continuous band shape. In this case, the open holes 180 which are arranged in the same column in the longitudinal direction (i.e., Y direction) of the metal film 140 have the same sizes. By contrast, the open holes 180 have different sizes in the width direction W (i.e., X direction) of the metal film 140.

Furthermore, the open holes 180 which are formed at predetermined intervals 'd1' in the longitudinal direction (i.e., Y direction) of the metal film 140 have the same size. Open holes of the open holes 180 which are arranged in the same column may be formed at predetermined intervals "d2". As shown in FIG. 4, the plurality of open holes 180 may be formed in regular square grooves at predetermined intervals over an entire area of the metal film 140.

Accordingly, since sizes of the open holes 180 vary proportionally to a Gaussian distribution of a laser beam, uniform energy distribution due to reflection of the laser beam may be achieved on the sealing portion 130.

Figure 5:
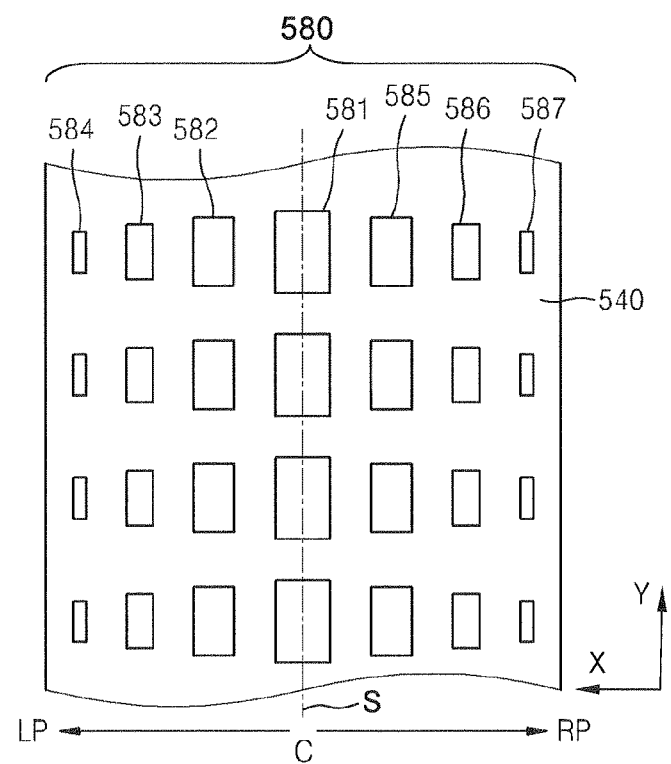
FIG. 5 is an enlarged plan view illustrating a pattern of a metal film constructed with another embodiment of the present invention.

FIG. 5 is an enlarged plan view illustrating a pattern of a metal film 540 constructed with another embodiment of the present invention.

Referring to FIG. 5, the metal film 540 is continuously connected in one direction (Y direction) of a substrate. Open holes 580 whose sizes vary according to energy intensities of a laser beam are formed in the metal film 540. Open holes 580 may include open holes 581 through 587.

That is, the open holes 580 are formed such that sizes of a plurality of first open holes 581 which are aligned with the axis of symmetry S in one direction (that is, Y direction) at a central portion C in a width direction of the metal film 540 where an energy intensity of a laser beam is the highest are the largest; sizes of a plurality of second open holes 582, a plurality of third open holes 583, and a plurality of fourth open holes 584 which are aligned with the axis of symmetry S in a left edge portion LP where an energy intensity of a laser beam is lower are gradually reduced in the order listed above and sizes of a plurality of fifth open holes 585, a plurality of sixth open holes 586, and a plurality of open holes 587 which are aligned with the axis of symmetry S in a right edge portion RP where an energy intensity of a laser beam is lower are gradually reduced in the order listed above, in proportion to energy intensities of a laser beam.

Also, the plurality of second open holes 582, the plurality of third open holes 583, and the plurality of fourth open holes 584 which are aligned with the axis of symmetry S in the left edge portion LP are symmetrical respectively with the plurality of fifth open holes 585, the plurality of sixth open holes 586, and the plurality of seventh open holes 587 which are aligned with the axis of symmetry S in the right edge portion RP about a central portion C in the width direction of the metal film 540.

In one embodiment, open holes 580 may be aligned with the axis of symmetry S of the metal film 540.

In one embodiment, open holes 584 may be symmetrical with open holes 587 with respect to the axis of symmetry S of the metal film 540; open holes 583 may be symmetrical with open holes 586 with respect to the axis of symmetry S of the metal film 540; open holes 582 may be symmetrical with open holes 585 with respect to the axis of symmetry S of the metal film 540; and open holes 581 may be formed symmetrically with respect to the axis of symmetry S of the metal film 540.

In FIG. 5, although the open holes 580 have rectangular shapes over an entire area of the metal film 540, the present embodiment is not limited thereto. For example, the open holes 580 may have polygonal shapes other than rectangular shapes, circular shapes, or oval shapes. The open holes 580 may be formed to have combinations of polygonal shapes, circular shapes, and oval patterns, as long as the open holes 580 which are aligned with the axis of symmetry S have the same area.

Accordingly, sizes of the plurality of first open holes 581 which are aligned with the axis of symmetry S at the central portion C in the width direction of the metal film 540 are the largest; sizes of the plurality of fourth open holes 584 which are aligned with the axis of symmetry S at a leftmost edge and the plurality of seventh open holes 587 which are aligned with the axis of symmetry S at a rightmost edge are the smallest.

Figure 6:
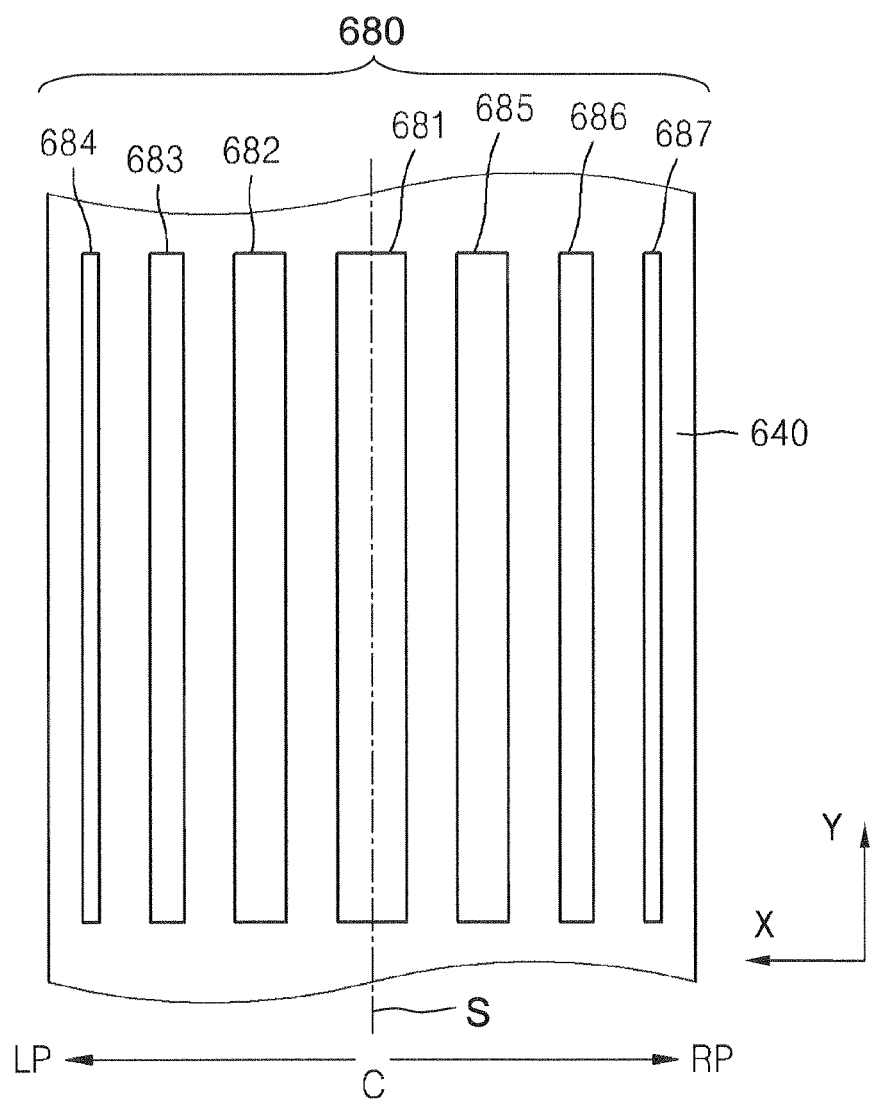
FIG. 6 is an enlarged plan view illustrating a pattern of a metal film constructed with another embodiment of the present invention.

FIG. 6 is an enlarged view illustrating a pattern of a metal film 640 constructed with another embodiment of the present invention.

Referring to FIG. 6, the metal film 640 is continuously connected in one direction (Y direction) of a substrate. Open holes 680 having different sizes are formed in the metal film 640. Open holes 680 may include open holes 681 through 687.

Among the open holes 680, sizes of a plurality of first open holes 681 which are aligned in one direction (Y direction) at a central portion C in a width direction of the metal film 640 where an energy intensity of a laser beam applied to the metal film 640 is the highest are the largest.

Also, the open holes 680 are formed such that sizes of a second open hole 682, a third open hole 683, and a fourth open hole 684 which are aligned with the axis of symmetry S of the metal film 640 in a left edge portion LP where an energy intensity of a laser beam is lower are gradually reduced in the order listed above; a fifth open hole 685, a sixth open hole 686, and a seventh open hole 687 which are aligned with the axis of symmetry S in a right edge portion RP where an energy intensity of a laser beam is lower are gradually reduced in the order listed above, in proportion to energy intensities of a laser beam.

In this case, unlike the open holes 180 of FIG. 4 and the open holes 580 of FIG. 5, the open holes 680 have strip shapes continuously formed in one direction (Y direction) of the substrate.

In one embodiment, a single first open hole 681, a single second open hole 682, a single third open hole 683, a single fourth open hole 684, a single fifth open hole 685, a single sixth open hole 686, and a single seventh open hole 687 may be formed parallel with each other along the axis of symmetry S, and the open holes 681 through 687 extend through the entire scan direction of the laser beam L.

Accordingly, the open holes 680 are formed such that sizes of the plurality of first open holes 681 which are aligned with the axis of symmetry S at the central portion C in the width direction of the metal film 640 are the largest; sizes of the plurality of fourth open holes 684 which are aligned with the axis of symmetry S at a leftmost edge and the plurality of seventh open holes 687 which are aligned with the axis of symmetry S at a rightmost edge are the smallest.

Figure 7:
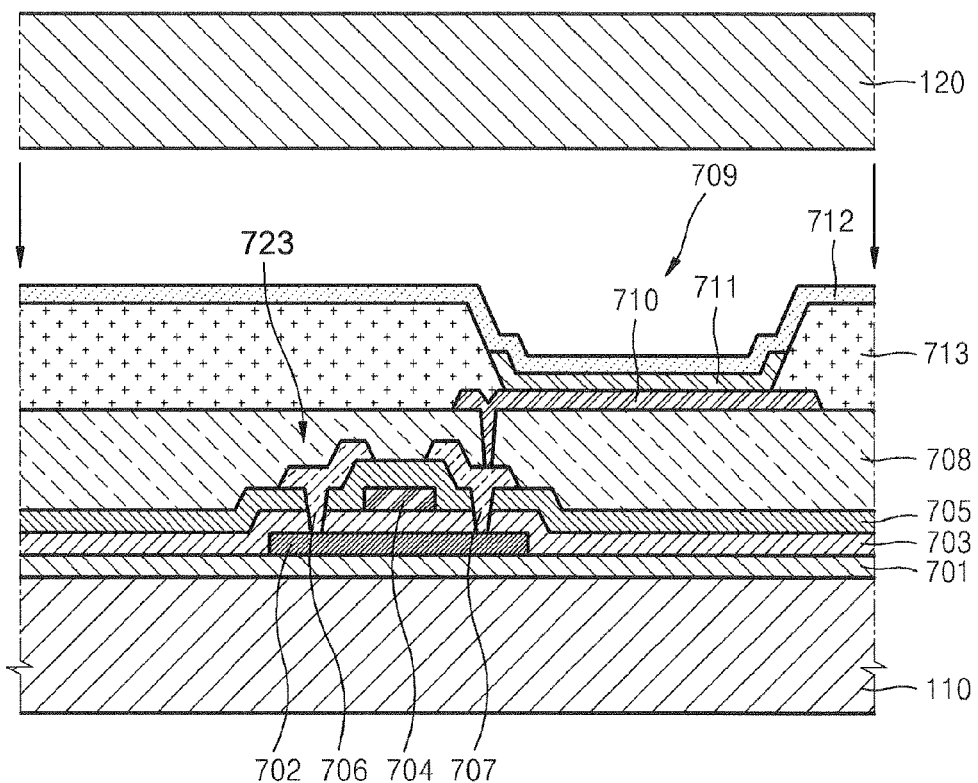
FIG. 7 is an enlarged cross-sectional view illustrating a display portion of the display apparatus of FIG. 1.

FIG. 7 is an enlarged cross-sectional view illustrating a case where the display portion 150 of the display apparatus 100 of FIG. 1 is formed as an organic light-emitting device.

Referring to FIG. 7, a buffer layer 701 is formed on the first substrate 110. The buffer layer 701 provides a flat surface on a top surface of the first substrate 110 and prevents moisture and impurities from penetrating into the first substrate 110.

A semiconductor active layer 702 having a predetermined pattern is formed on the buffer layer 701. The semiconductor active layer 702 may be formed of an inorganic material such as amorphous silicon or polysilicon, or an organic semiconductor, and the semiconductor active layer 702 includes a source region, a drain region, and a channel region.

The source and drain regions of the semiconductor active layer 702 may be formed by doping the semiconductor active layer 702 formed of amorphous silicon or polysilicon with impurities. If the semiconductor active layer 702 is doped with Group III elements including boron (B), a P-type semiconductor may be formed; if the semiconductor active layer 702 is doped with Group V elements including nitrogen (N), an N-type semiconductor may be formed.

A gate insulating film 703 is formed on the semiconductor active layer 702, and a gate electrode 704 is formed on a predetermined portion on the gate insulating film 703. The gate insulating film 703 for insulating the semiconductor active layer 702 and the gate electrode 704 may be formed of an organic material or an inorganic material such as $SiN_x$ or $SiO_2$.

The gate electrode 704 may be formed of a metal such as gold (Au), silver (Ag), copper (Cu), nickel (Ni), platinum (Pt), palladium (Pd), aluminum (Al), molybdenum (Mo), or an alloy such as Al:Nd or Mo:W, but the present embodiment is not limited thereto and the gate electrode 704 may be formed of any of various materials in consideration of adhesion, flatness, electrical resistance, processability, and so on. The gate electrode 704 is electrically connected to a gate line (not shown) that applies an electrical signal.

An interlayer insulating film 705 is formed on the gate electrode 704. The interlayer insulating film 705 and the gate insulating film 703 are formed to expose the source region and the drain region of the semiconductor active layer 702, and a source electrode 706 and a drain electrode 707 respectively contact the exposed source and drain regions of the semiconductor active layer 702.

Each of the source electrode 706 and the drain electrode 707 may be formed of gold (Au), palladium (Pd), platinum (Pt), nickel (Ni), rhodium (Rh), ruthenium (Ru), iridium (Ir), osmium (Os), aluminum (Al), molybdenum (Mo), or an alloy such as Al:Nd or Mo:W, but the present embodiment is not limited thereto.

Accordingly, a thin film transistor (TFT) 723 including the semiconductor active layer 702, the gate electrode 704, the source electrode 706, and the drain electrode 707 is formed.

A passivation layer 708 is formed to cover the source electrode 706 and the drain electrode 707. The passivation layer 708 may be an inorganic insulating film and/or an organic insulating film. The passivation layer 708 may be formed as a composite stack including an inorganic insulating film and an organic insulating film.

The inorganic insulating film may include $SiO_2$, $SiN_x$, SiON, $Al_2O_3$, $TiO_2$, $Ta_2O_5$, $HfO_2$, $ZrO_2$, BST, PZT, or the like, and the organic insulating film may include a commercial polymer (PMMA or PS), a polymer derivative having a phenol group, an acryl-based polymer, an imide-based polymer, an allyl ether-based polymer, an amide-based polymer, a fluorine-based polymer, a p-xylen-based polymer, a vinyl alcohol-based polymer, or a mixture thereof.

The passivation layer 708 is formed to expose a portion of the drain electrode 707, and an organic light-emitting device 709 is formed to be connected to the exposed portion of the drain electrode 707. The organic light-emitting device 709 includes a first electrode 710, a second electrode 712, and an intermediate layer 711.

In detail, the first electrode 710 and the drain electrode 707 electrically contact each other. The intermediate layer 711 includes an organic light-emitting layer, and generates visible light when a voltage is applied through the first electrode 710 and the second electrode 712.

A pixel defining layer (PDL) 713 formed of an insulating material is formed on the first electrode 710. A portion of the first electrode 710 is exposed by forming a predetermined hole in the PDL 713. The intermediate layer 711 that is an organic light-emitting portion is formed on the exposed portion of the first electrode 710. The second electrode 712 is formed on the intermediate layer 711.

The first electrode 711 and the second electrode 712 respectively act as an anode and a cathode. Alternatively, polarities of the first electrode 711 and the second electrode 712 may be exchanged and thus the first electrode 711 and the second electrode 712 may respectively act as a cathode and an anode.

The second substrate 120 is disposed on the second electrode 712. When the second electrode 712 is formed, the metal film 140 (see FIG. 1) formed of the same material as that of the second electrode 712 is formed on the non-display portion 160 (see FIG. 1) formed outside the display portion 150. The metal film 140 and the second electrode 712 are electrically insulated from each other.

As described above, a display apparatus including an enhanced sealing portion according to the present invention has the following advantages.

First, during sealing in a sealing region by using a laser, since a metal film having a specific shape is patterned, even when energy having an irregular Gaussian profile is applied, uniform energy may be applied to a sealing portion. Accordingly, an adhesive force in the sealing region may be increased.

Second, since uniformity of an adhesive force is improved, even when there is an external impact, the strength of a panel may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
a substrate unit that comprises a first substrate and a second substrate facing each other;
a sealing portion that is disposed between the first substrate and the second substrate; and
a metal film that is disposed between the first substrate and the sealing portion, and the metal film comprising open holes, the open holes of the metal film having different sizes in proportion to energy intensities of an energy source applied to the metal film.

2. The display apparatus of claim 1, wherein sizes of the open holes are reduced from a portion applied with a highest energy intensity of the energy source toward a portion applied with a lower energy intensity of the energy source.

3. The display apparatus of claim 2, wherein at least a fraction of the metal film overlaps with the sealing portion, wherein sizes of the open holes are reduced from a central portion of the metal film toward edges of the metal film.

4. The display apparatus of claim 3, wherein the sealing portion and the metal film are continuously connected along edges of the first substrate,
wherein the open holes are discretely formed along an extending direction of the metal film.

5. The display apparatus of claim 4, wherein the open holes have the same size in the extending direction of the metal film, and the open holes have different sizes in a width direction perpendicular to the extending direction of the metal film.

6. The display apparatus of claim 5, wherein the open holes formed at first predetermined intervals in the extending direction of the metal film have the same size, and the open holes formed at second predetermined intervals in the width direction of the metal film have sizes reduced toward from a center of the metal film toward an edge of the metal film.

7. The display apparatus of claim 6, wherein sizes of a plurality of open holes which are aligned along an axis of symmetry of the metal film at the central portion in the width direction of the metal film are the largest, and sizes of a plurality of open holes which are aligned along the axis of symmetry of the metal film at leftmost and rightmost edges in the width direction of the metal film are the smallest.

8. The display apparatus of claim 3, wherein sizes of a plurality of open holes which are aligned along an extending direction of the metal film at the central portion in a width direction of the metal film perpendicular to the extending direction of the metal film are the largest, and sizes of a plurality of open holes which are aligned along the extending direction of the metal film at leftmost and rightmost edges in the width direction of the metal film are the smallest.

9. The display apparatus of claim 4, wherein the open holes have polygonal shapes, circular shapes, oval shapes, or combinations thereof.

10. The display apparatus of claim 3, wherein the open holes are laterally symmetrical with each other with respect to an axis of symmetry of the metal film along an extending direction of the metal film.

11. The display apparatus of claim 3, wherein the sealing portion and the metal film are continuously connected along edges of the first substrate,
wherein the open holes are continuously formed in an extending direction of the metal film.

12. The display apparatus of claim 11, wherein the open holes are formed at predetermined intervals to have sizes reduced from a center toward an edge in a width direction perpendicular to the extending direction of the metal film.

13. The display apparatus of claim 11, wherein the open holes are arranged in strip shapes.

14. The display apparatus of claim 3, wherein the open holes are grooves that penetrate the metal film in a thickness direction of the metal film.

15. The display apparatus of claim 1, wherein the energy source is a laser beam.

16. The display apparatus of claim 1, wherein the display apparatus further comprises an organic light-emitting display device,
wherein the first substrate is divided into a display portion that is a light-emitting area, and a non-display portion that is formed outside the display portion,
wherein the metal film is formed of the same material as that of a pattern layer formed in the display portion.

17. The display apparatus of claim 16, wherein the organic light-emitting display device comprises a first electrode, a light-emitting portion, and a second electrode that are sequentially stacked on the first substrate, and the metal film is formed of the same material as that of the second electrode.

18. The display apparatus of claim 16, wherein the sealing portion is formed along a circumference of the display portion,
wherein at least one portion of the metal film overlaps with the sealing portion,
wherein the open holes are formed to have different sizes over an entire area of the metal film.

19. The display apparatus of claim 18, wherein the open holes are formed at predetermined intervals to have the same size in an extending direction of the metal film, and are formed at predetermined intervals to have sizes reduced from a center toward an edge in a width direction perpendicular to the extending direction of the metal film.

20. The display apparatus of claim 1, wherein the sealing portion comprises glass frit.

21. The display apparatus of claim 1, wherein the metal film is formed of an alloy including at least one of lithium (Li), calcium (Ca), lithium fluoride (LiF), aluminum (Al), magnesium (Mg), molybdenum (Mo), titanium (Ti), and silver (Ag).

* * * * *